US012757736B2

(12) United States Patent
Kaneko et al.

(10) Patent No.: US 12,757,736 B2
(45) Date of Patent: Oct. 6, 2026

(54) FIELD EFFECT TRANSISTOR

(71) Applicant: OOKUMA DIAMOND DEVICE Inc., Sapporo (JP)

(72) Inventors: Junichi Kaneko, Sapporo (JP); Hitoshi Koizumi, Sapporo (JP); Takahiro Yamaguchi, Sapporo (JP); Naohisa Hoshikawa, Sapporo (JP); Hitoshi Umezawa, Ikeda (JP); Hideaki Yamada, Ikeda (JP); Shinya Ohmagari, Tosu (JP)

(73) Assignee: OOKUMA DIAMOND DEVICE Inc., Sapporo (JP)

( * ) Notice: Subject to any disclaimer, the term of this patent is extended or adjusted under 35 U.S.C. 154(b) by 608 days.

(21) Appl. No.: 18/259,942

(22) PCT Filed: Dec. 28, 2021

(86) PCT No.: PCT/JP2021/048979
§ 371 (c)(1),
(2) Date: Jun. 29, 2023

(87) PCT Pub. No.: WO2022/145476
PCT Pub. Date: Jul. 7, 2022

(65) Prior Publication Data

US 2024/0088058 A1 Mar. 14, 2024

(30) Foreign Application Priority Data

Dec. 29, 2020 (JP) ................................. 2020-219861

(51) Int. Cl.
*H10D 30/60* (2025.01)
*H10D 62/17* (2025.01)
(Continued)

(52) U.S. Cl.
CPC ............ *H10W 42/20* (2026.01); *H10D 30/60* (2025.01); *H10D 62/378* (2025.01); *H10D 62/8303* (2025.01)

(58) Field of Classification Search
CPC ...... H01L 23/552; H01L 21/0405–044; H10D 62/378; H10D 62/8303; H10D 30/472;
(Continued)

(56) References Cited

U.S. PATENT DOCUMENTS

| | | | |
|---|---|---|---|
| 5,854,496 | A | 12/1998 | Ishikura et al. |
| 7,981,721 | B2 | 7/2011 | Scarsbrook et al. |

(Continued)

FOREIGN PATENT DOCUMENTS

| | | | |
|---|---|---|---|
| JP | 10-125932 | A | 5/1998 |
| JP | 2005-175278 | A | 6/2005 |

(Continued)

OTHER PUBLICATIONS

Chen, Zhihao et al., "Negative constant voltage stress-induced threshold voltage instability in hydrogen-terminated diamond MOSFETs with low-temperature deposited $Al_2O_3$," Applied Physics Letters, vol. 117, 2020, 5 pages, XP012250379.

(Continued)

*Primary Examiner* — Shahed Ahmed
(74) *Attorney, Agent, or Firm* — Oblon, McClelland, Maier & Neustadt, L.L.P.

(57) ABSTRACT

A field effect transistor comprising: a non-doped diamond layer which has a hydrogen-terminated surface; first and second p+diamond layers which are formed on the non-doped diamond layer and sandwich a hydrogen-terminated region; a source electrode which is formed on the first p+diamond layer and is made of metal; a drain electrode which is formed on the second p+diamond layer and is made of metal; an insulating layer which is formed on the hydro-
(Continued)

gen-terminated region of the non-doped diamond layer; and a gate electrode which is formed on the insulating layer, a mutual conductance being equal to or higher than 0.5 mS/mm at room temperatures, after an X-ray is applied for an amount of 5 Mgy.

10 Claims, 11 Drawing Sheets

(51) Int. Cl.
*H10D 62/83* (2025.01)
*H10W 42/20* (2026.01)

(58) Field of Classification Search
CPC .. H10D 30/6741; H10D 64/665; H10D 64/62; H10D 64/691; H10D 30/60–798; H10D 30/021–0415; C01B 32/25–28
See application file for complete search history.

(56) References Cited

U.S. PATENT DOCUMENTS

| | | | | |
|---|---|---|---|---|
| 2005/0127373 | A1* | 6/2005 | Yokota | H10D 62/8303 257/77 |
| 2008/0099768 | A1 | 5/2008 | Scarsbrook et al. | |
| 2019/0348284 | A1* | 11/2019 | Miyazaki | H01L 21/02178 |

FOREIGN PATENT DOCUMENTS

| | | | |
|---|---|---|---|
| JP | 2016-127088 | A | 7/2016 |
| JP | 2018-6572 | A | 1/2018 |

OTHER PUBLICATIONS

Yu, Cui et al., “650 mW/mm output power density of H-terminated polycrystalline diamond MISFET at 10 GHz,” Electronics Letters, vol. 56, No. 7, Mar. 30, 2020, 2 pages, XP006089837.
Extended European Search Report issued Oct. 14, 2024 in European Patent Application No. 21915334.3, 10 pages.
International Search Report issued Mar. 15, 2022 in PCT/JP2021/048979 filed on Dec. 28, 2021 2 pages.
Umezawa, H. et al. “Characterization of X-Ray Radiation Hardness of Diamond Schottky Barrier Diode and Metal-Semiconductor Field-Effect Transistor” 29thInternational Symposium on Power Semiconductor Devices and IC’s; IEEE; Jul. 2017 (4 pages).
Umezawa, H. “Diamond Semiconductor Devices, State-of-the-art material growth and device processing” International Electron Devices Meeting (IEDM). IEEE Dec. 18, 2020 (5 pages).
Japanese Office Action issued Sep. 20, 2025 in Japanese Patent Application No. 2021-213178 (with unedited computer-generated English Translation), 3 pages.

* cited by examiner

FIELD EFFECT TRANSISTOR

TECHNICAL FIELD

The present invention relates to a field effect transistor.

BACKGROUND ART

An electronic component used under a high-radiation environment such as the inside of a nuclear reactor is required to be highly resistant to radiation. A candidate of a semiconductor material for achieving such high radiation resistance is diamond. A Non-Patent Literature 1 describes a MESFET (Metal-Semiconductor Field Effect Transistor) that is an example of a field effect transistor using diamond semiconductor. The MESFET of Non-Patent Literature 1 includes a semi-insulating diamond substrate doped with nitrogen, a p−drift layer formed on the substrate and made of diamond, a p+contact layer formed on the p−drift layer and made of diamond, a source electrode and a drain electrode formed on the layers, and a gate electrode formed on the p−drift layer. The gate electrode includes ruthenium. The document describes that, when an X-ray is applied to such a MESFET for amounts of 5 MGy and 10 MGy, the maximum drain current and mutual conductance of the MESFET are substantially constant relative to the application.

CITATION LIST

Non-Patent Literature

[Non-Patent Literature 1] Hitoshi UMEZAWA, Shinya OHMAGARI, and Yoshiaki MOKUNO; Characterization of X-ray radiation hardness of diamond Schottky barrier diode and metal-semiconductor field-effect transistor; 29th International Symposium on Power Semiconductor Devices and IC's; IEEE; July 2017; p. 379 to 382

SUMMARY OF INVENTION

Technical Problem

As described above, the MESFET of Non-Patent Literature 1 is highly resistant to the application of an X-ray. However, the field effect transistor of Non-Patent Literature 1 has a low mutual conductance of 0.01 mS/mm, and may not satisfy the conditions of circuit characteristics required as an electronic component.

An object of the present invention is to provide a field effect transistor which is highly resistant to radiation and has sufficient circuit characteristics.

Solution to Problem

A field effect transistor of the present invention comprises: a non-doped diamond layer which has a hydrogen-terminated surface; first and second p+diamond layers which are formed on the non-doped diamond layer and sandwich a hydrogen-terminated region; a source electrode which is formed on the first p+diamond layer and is made of metal; a drain electrode which is formed on the second p+diamond layer and is made of metal; an insulating layer which is formed on the hydrogen-terminated region of the non-doped diamond layer; and a gate electrode which is formed on the insulating layer, a mutual conductance being equal to or higher than 0.5 mS/mm at room temperatures, after an X-ray is applied for an amount of 5 MGy.

The field effect transistor of the present invention employs a structure in which an insulating layer and a gate electrode are provided on a hydrogen-terminated non-doped diamond layer. This arrangement makes it possible to secure circuit characteristics with which a mutual conductance is equal to or higher than 0.5 mS/mm at room temperatures after an X-ray is applied for an amount of 5 MGy. Application of an X-ray for an amount of 5 MGy corresponds to a case where, for example, an electronic circuit to which the present invention is applied is used inside a nuclear reactor. Under this environment, the present invention makes it possible to secure circuit characteristics with which the mutual conductance is equal to or higher than 0.5 mS/mm. It is therefore possible to attain circuit characteristics necessary for electronic circuits even under a severely high-radiation environment inside a nuclear reactor that is normally driven, after a severe accident, or during decommission. The possibility of the attainment of the circuit characteristics under such environments does not indicate that the application of the present invention is limited to the space inside a nuclear reactor. The present invention is applicable to various environments such as an accelerator, radiation therapy, a nuclear fusion reactor, a space environment, and an aerospace environment.

In the present invention, preferably, the insulating layer includes aluminum oxide. The resistance to radiation of the isolation layer is improved by this arrangement.

In the present invention, preferably, each of the source electrode, the drain electrode, and the gate electrode includes at least one of ruthenium, iridium, platinum, or molybdenum. The resistance to radiation of the electrodes is improved by this arrangement. In this regard, the electrode may include a combination of at least one of ruthenium, iridium, platinum, or molybdenum and another metal such as gold. For example, a layer made of another metal such as gold may be deposited on a layer made of at least one of ruthenium, iridium, platinum, or molybdenum.

In the present invention, preferably, the field effect transistor further comprises a recovery electrode which is an independent electrode different from the source electrode, the drain electrode, and the gate electrode, and is configured to recover circuit characteristics by at lest one of recovery of defects through thermal recovery or drawing out charges. This arrangement makes it possible to recover the circuit characteristics deteriorated due to the application of radiation. In the present invention, preferably, after application of an X-ray for an amount of 5 MGy, a leak current of the gate electrode is $10^{-6}$ times as large as an operation drain current at the maximum. This arrangement makes it possible to construct a field effect transistor in which a leak current is suppressed by the present invention.

BRIEF DESCRIPTION OF DRAWINGS

Each of FIG. 2(*a*) to FIG. 2(*d*) is a graph showing drain current vs drain voltage characteristics related to an example of the field effect transistor shown in FIG. 1. FIG. 2(*b*) relates to the characteristics at the time of application of an X-ray for an amount of 10 kGy. FIG. 2(*c*) relates to the characteristics at the time of application of an X-ray for an amount of 100 kGy. FIG. 2(*d*) relates to the characteristics at the time of application of an X-ray for an amount of 1 MGy.

FIG. 4(*b*) is a graph showing mutual conductance relative to an integral dose of the X-ray. FIG. 4(*c*) is a graph showing a change of a threshold voltage relative to an integral dose of the X-ray.

DESCRIPTION OF EMBODIMENTS

Figure 1:
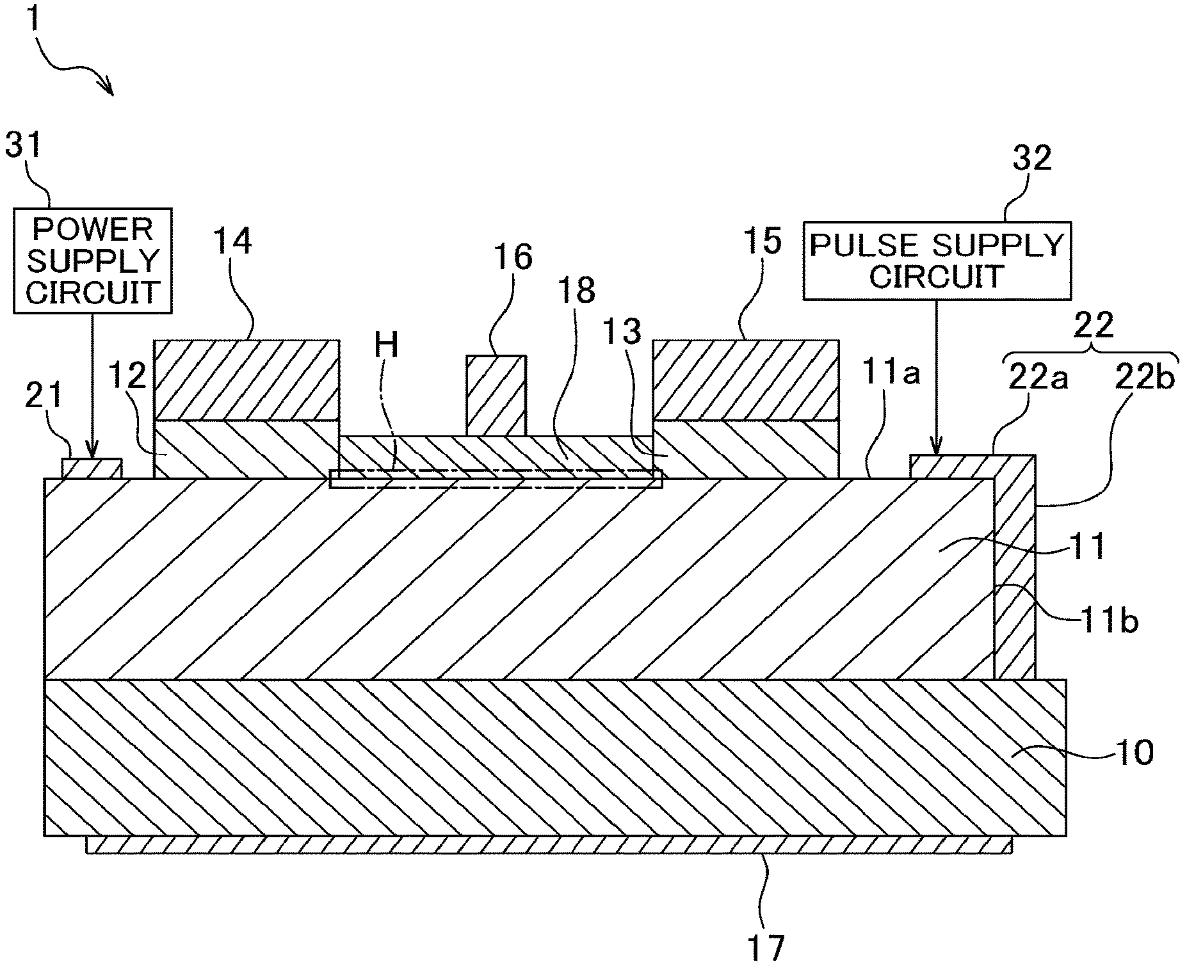
FIG. 1 is conceptual diagram showing the structure of a field effect transistor of an embodiment of the present invention.

The following will describe a field effect transistor 1 of an embodiment of the present invention with reference to FIG. 1. As shown in FIG. 1, the field effect transistor 1 has a layered structure in which a semi-insulating diamond substrate layer 10, a hydrogen-terminated diamond layer 11 (equivalent to a non-doped diamond layer of the present invention), a p+diamond layer 12, a p+diamond layer 13, a source electrode 14, a drain electrode 15, a gate electrode 16, a back gate electrode 17, and an insulating layer 18 are deposited.

The semi-insulating diamond substrate layer 10 is made of diamond doped with nitrogen. This layer is 50 to 500 μm thick, and the concentration of nitrogen is $10^{17}$ to $10^{20}$ atoms/cm$^3$. Due to the presence of the semi-insulating diamond substrate layer 10 doped with nitrogen, a short-channel effect, increase in drain conductance in the saturated region, and decrease in output impedance are suppressed. To allow the mutual conductance to be not lower than 0.5 mS/mm as described below, the defect density of the substrate is preferably equal to or smaller than $10^6$/cm$^2$.

The hydrogen-terminated diamond layer 11 is formed on the semi-insulating diamond substrate layer 10. The hydrogen-terminated diamond layer 11 is made of non-doped diamond that is not doped with impurities. The hydrogen-terminated diamond layer 11 is preferably 3 μm or less in thickness. This arrangement makes it possible to prevent the decrease in the output impedance. In a region H where the insulating layer 18 is stacked on a stacking target surface 11*a* that is a surface of the hydrogen-terminated diamond layer 11, a hydrogen-terminated conductive layer is formed. The hydrogen-terminated diamond layer 11 is formed by, for example, CVD (Chemical Vapor Deposition). The hydrogen-terminated conductive layer is formed in such a way that a surface of the diamond is exposed to hydrogen plasma when the diamond layer is formed by CVD.

The p+diamond layers 12 and 13 are formed on the stacking target surface 11*a* of the hydrogen-terminated diamond layer 11. These layers are provided to be spaced apart from each other on the hydrogen-terminated diamond layer 11. The p+diamond layers 12 and 13 are made of diamond doped with boron atoms that are impurities. The density of boron in the p+diamond layers 12 and 13 is $10^{19}$ to $10^{22}$ atoms/cm$^3$. The p+diamond layers 12 and 13 are formed by, for example, CVD.

On the stacking target surface 11*a* of the hydrogen-terminated diamond layer 11, the insulating layer 18 is formed in a region sandwiched between the p+diamond layer 12 and the p+diamond layer 13. The insulating layer 18 is made of aluminum oxide ($Al_2O_3$). The insulating layer 18 is formed by, for example, high-temperature ALD (Atomic Layer Deposition).

The source electrode 14 is formed on the p+diamond layer 12, the drain electrode 15 is formed on the p+diamond layer 13, and the gate electrode 16 is formed on the insulating layer 18. The source electrode 14 is only in contact with the p+diamond layer 12, the drain electrode 15 is only in contact with the p+diamond layer 13, and the gate electrode 16 is only in contact with the insulating layer 18. The back gate electrode 17 is formed on a surface of the semi-insulating diamond substrate layer 10, which is opposite to the hydrogen-terminated diamond layer 11. The back gate electrode 17 is only in contact with the semi-insulating diamond substrate layer 10. The source electrode 14, the drain electrode 15, the gate electrode 16, and the back gate electrode 17 include ruthenium. These electrodes are formed by, for example, RF sputtering.

A recovery electrode 21 is formed in a region of the stacking target surface 11*a* of the hydrogen-terminated diamond layer 11. This region is adjacent to the regions where the p+diamond layers 12 and 13 and the insulating layer 18 are stacked. The recovery electrode 21 is only in contact with the hydrogen-terminated diamond layer 11. The recovery electrode 21 is entirely made of ruthenium or is arranged so that a surface of a metal electrode main body is coated with ruthenium. The electrode main body may be made of any metal as long as power of not smaller than 10 W can be supplied to the electrode main body. The recovery electrode 21 is connected to a power supply circuit 31. The power supply circuit 31 supplies power of not smaller than 10 W by supplying a current to the recovery electrode 21. The temperature of the field effect transistor 1 is increased by the heat from the recovery electrode 21 generated by the power supply. The recovery electrode 21 is formed by, for example, RF sputtering.

The recovery electrode 22 has a part 22*a* extending along the stacking target surface 11*a* of the hydrogen-terminated diamond layer 11 and a part 22*b* extending along a side end face 11*b* of the hydrogen-terminated diamond layer 11. On the stacking target surface 11*a*, the part 22*a* is formed in a region adjacent to the regions where the p+diamond layers 12 and 13 and the insulating layer 18 are stacked. The part 22*b* extends from an end portion of the part 22*a* to the semi-insulating diamond substrate layer 10, along the side end face 11*b*. With this arrangement, the recovery electrode 22 is in contact with both the hydrogen-terminated diamond layer 11 and the semi-insulating diamond substrate layer 10. The recovery electrode 22 is entirely made of ruthenium or is arranged so that a surface of a metal electrode main body is coated with ruthenium. The electrode main body may be made of any metal. The recovery electrode 22 is connected to a pulse supply circuit 32. The pulse supply circuit 32 applies a square-wave pulse voltage signal to the recovery electrode 22. The pulse voltage signal is, for example, a signal in which a state of continuation of a voltage of +100 V for a predetermined time and a state of continuation of a voltage of −100 V for a predetermined time are alternately switched at predetermined time intervals. The recovery electrode 22 is formed by, for example, sputtering.

The field effect transistor 1 of the present embodiment has the circuit characteristics with which the mutual conductance is equal to or higher than 0.5 mS/mm at room temperatures, even after an X-ray is applied to the transistor for a large integral dose that is 5 MGy. The circuit characteristics are attained under such a high-radiation environment because, as a result of diligent investigation, the inventors of the present invention employ the structure of the present embodiment in which the p+diamond layers 12 and 13 are provided at the source and the drain and the insulating layer 18 is provided on the hydrogen-terminated diamond layer 11. Thanks to the employment of this arrangement, the circuit characteristics with which the mutual conductance is equal to or higher than 0.5 mS/mm at room temperatures are achieved even after an X-ray is applied to the transistor for a large integral dose of 5 MGy as described in an example described below. Furthermore, similar circuit characteristics can be achieved under a high-temperature environment (e.g., 450 degrees centigrade).

The value 5 MGy corresponds to an integral dose for a period of about one week under a high-radiation environment that is the inside of a nuclear reactor after a severe accident, and the value was calculated by simulation. To construct a low-noise circuit, the amplification factor is required to be equal to or larger than 2 mS at least at room temperatures. Taking into account of the application of the invention to an electronic circuit used in a nuclear reactor, the amplification factor is preferably equal to or larger than 2 mS within a temperature from room temperatures to 450 degrees centigrade. On the other hand, in order to improve the resistance to radiation, the gate width is preferably equal to or shorter than 4 mm. For these reasons, the amplification factor is required to be equal to or larger than 0.5 mS/mm. Furthermore, by achieving the mutual conductance of 0.5 mS/mm, noise is reduced and the signal amplification is possible in a high frequency band. In order to amplify the pulse signal without degradation, the signal amplification is preferably possible for a high-frequency signal of 100 MHz or higher.

The field effect transistor 1 of the present embodiment is provided with the recovery electrodes 21 and 22. The recovery electrodes 21 and 22 recover an element degraded due to radiation application. There are two types of degradation due to radiation application, as described below. In the degradation of the first type, charges are accumulated in at least one of the hydrogen-terminated diamond layer 11, the p+diamond layers 12 and 13, the semi-insulating substrate 10, or the insulating layer 18, and this accumulation causes a variation in the threshold or a variation in the drain current, for example. Such degradation is resolved by supplying the pulse voltage signal from the pulse supply circuit 32 to the recovery electrode 22 as described above and drawing out the charges from the layer where the charges are accumulated. In the degradation of the second type, due to the generation of defects in the insulating layer 18, problems such as a variation of a threshold, decrease of the mutual conductance, and decrease of the drain current occur. Such degradation is resolved by repairing point defects in such a way that power is supplied from the power supply circuit 31 to the recovery electrode 21 as described above and the temperature of the field effect transistor 1 is increased to be equal to or higher than 600 degrees centigrade.

Each of the source electrode 14, the drain electrode 15, and the gate electrode 16 of the present embodiment includes ruthenium. Each of the recovery electrodes 21 and 22 is entirely made of ruthenium or is arranged so that a surface of a metal electrode main body is coated with ruthenium. The resistance to radiation of each electrode is therefore improved.

In the field effect transistor 1 of the present embodiment, changes of the circuit characteristics (e.g., the drain current vs drain voltage characteristics) due to application of radiation for a predetermined integral dose (e.g., 10 kGy) or more are preferably saturated. The drain conductance (output impedance) in a saturated region of the drain current vs drain voltage characteristics at the time of application of radiation for an amount of 10 kGy to 1 MGy is preferably equal to or more than 5 MΩmm. The drain conductance in a linear region of the drain current vs drain voltage characteristics at the time of application of radiation for an amount of 10 kGy to 1 MGy is preferably equal to or less than 2 MΩmm. A leak current with a gate voltage $V_{GS}<-3$ V at the time of application of radiation for an amount of 10 kGy to 1 MGy is preferably equal to or less than $10^{-7}$ A/mm. A sub-threshold swing at the time of application of radiation for an amount of 10 kGy to 1 MGy is preferably equal to or less than 300 mV/decade. Preferably, between non-application of radiation and application of radiation for an amount of 5 MGy, one or both of the absolute values of the maximum drain current and the mutual conductance is scarcely decreased. Preferably, between non-application of radiation and application of radiation for an amount of 5 MGy, a variation range of the threshold voltage is equal to or smaller than 3V.

Example 1

The following will describe an example of the field effect transistor of the present invention. The field effect transistor of the example corresponds to the field effect transistor of the embodiment above, from which the recovery electrodes 21 and 22 are removed. The field effect transistor was manufactured by the following method. To begin with, a hydrogen-terminated diamond layer 11 that was 1 μm thick was formed with a methane concentration of 0.5% on a diamond Ib (001) substrate (equivalent to the semi-insulating diamond substrate layer 10 by using a plasma CVD apparatus (AX5010-INT made by Seki Technotron Corp.). Subsequently, in order to form p+diamond layers 12 and 13 selectively in a predetermined region on the hydrogen-terminated diamond layer 11, a mask was formed by using the plasma CVD apparatus. Subsequently, the p+diamond layers 12 and 13 that were 0.4 μm were formed in a region where no mask was formed on the diamond layer 11, by an HF/CVD method. Subsequently, the mask was removed, an aluminum oxide layer that was 83 nm was formed by a high temperature ALD at 350 degrees centigrade, and then an insulating layer 18 was formed by etching using a reactive ion etching device. Subsequently, a source electrode 14, a drain electrode 15, and a gate electrode 16 made of ruthenium were formed by an RF sputtering method using a sputtering device.

The operation performance of the field effect transistor 1 manufactured as above was evaluated under a high-radiation environment, as described below. To begin with, under a room temperature environment, an X-ray was applied from an X-ray applicator to the field effect transistor 1 while the positional relationship between the field effect transistor 1 and the X-ray applicator was kept constant, in a stepwise manner so that the amount of the applied radioactive ray was changed to 1 kGy, 3 kGy, 10 kGy, 30 kGy, 100 kGy, 300 kGy, and 1000 kGy. In the step before the application of the X-ray and each step immediately after the X-ray of each value was applied, the performance of the field effect transistor was evaluated by using a semiconductor device parameter analyzer. Whether the radioactive ray applied to the field effect transistor 1 reached each value was grasped based on an evaluation of a dose per unit time obtained by a cellulose triacetate dosimeter and an application time. As a result of the evaluation of the dose, the dose per unit time was 1.1 kGy/minute.

Figure 2:
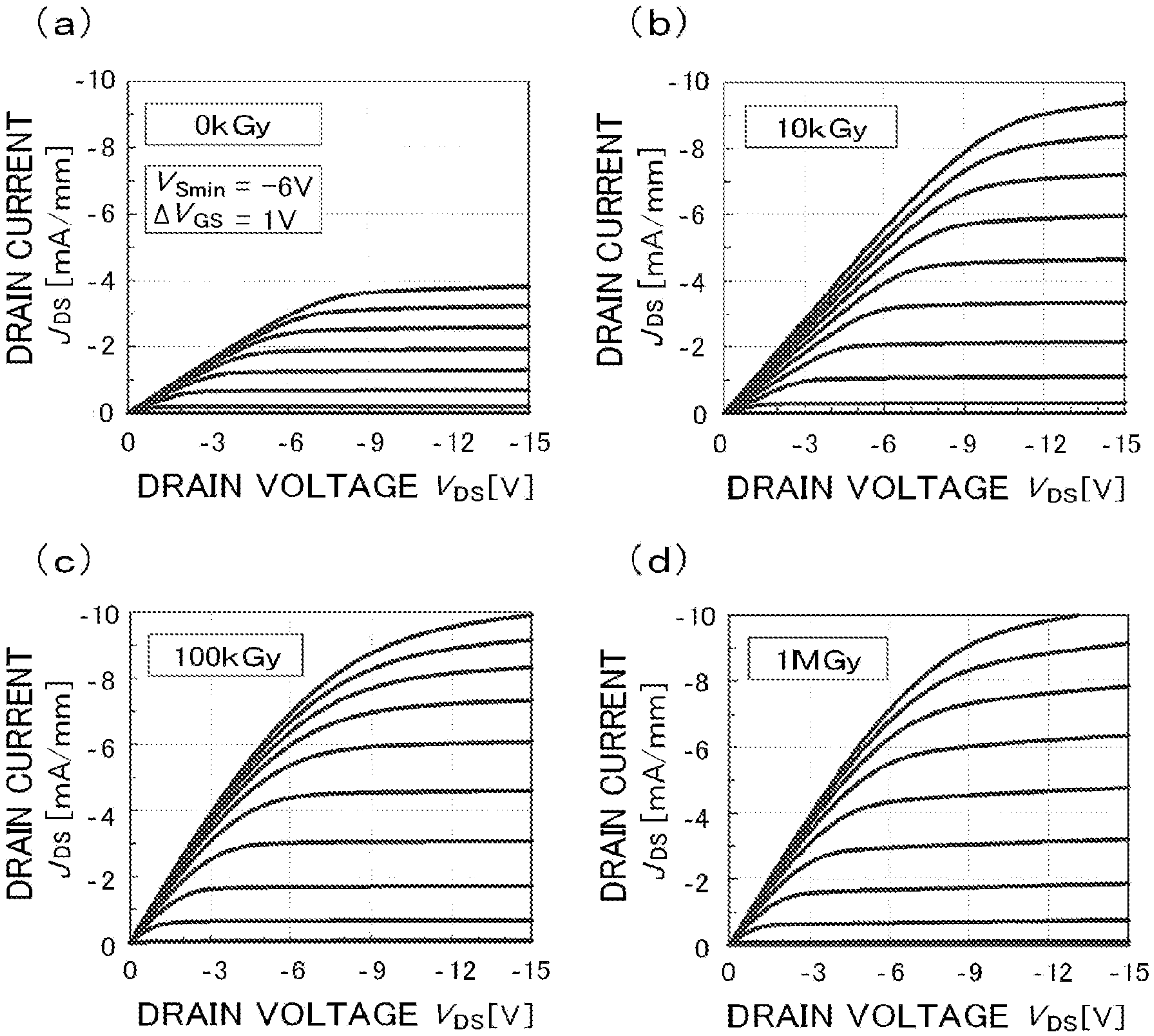
FIG. 2(*a*) relates to the characteristics before the application of an X-ray.
Figure 3:
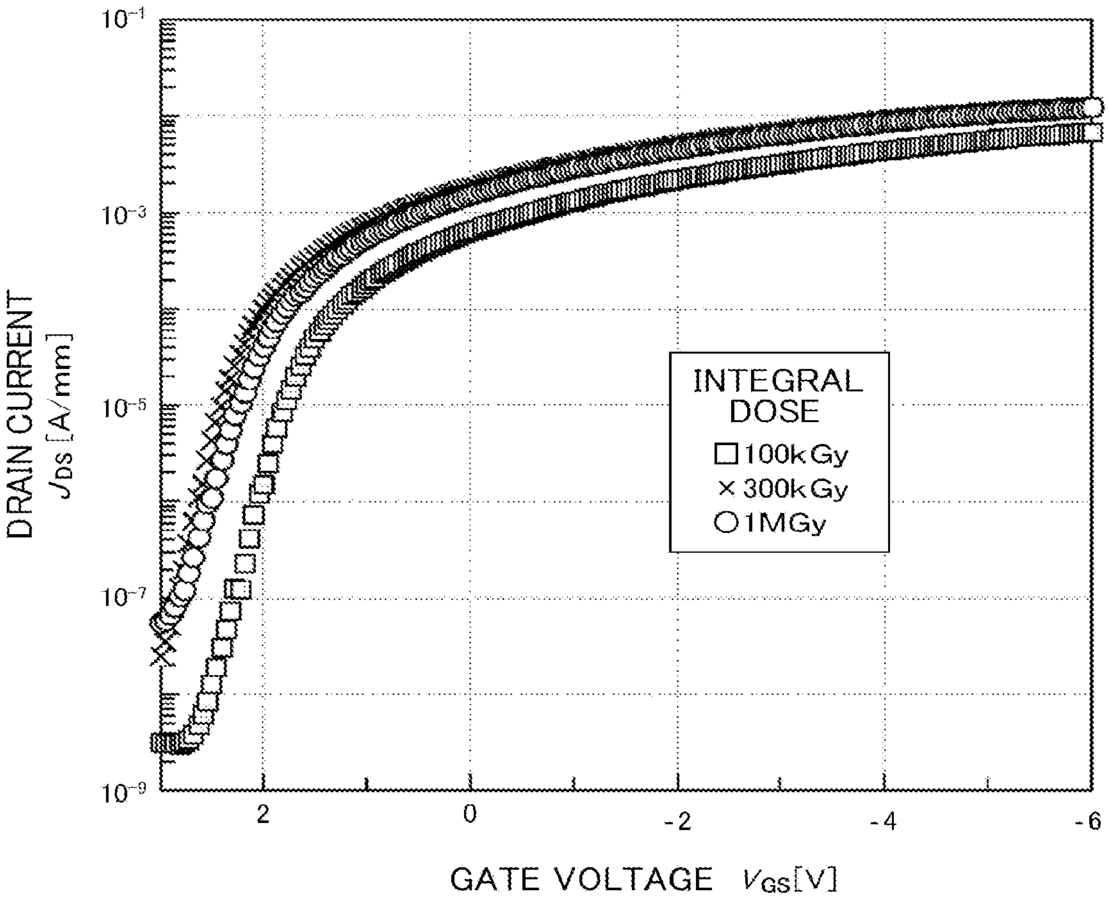
FIG. 3 is graph showing gate bias vs drain current characteristics related to an example of the field effect transistor of the embodiment shown in FIG. 1.
Figure 4:
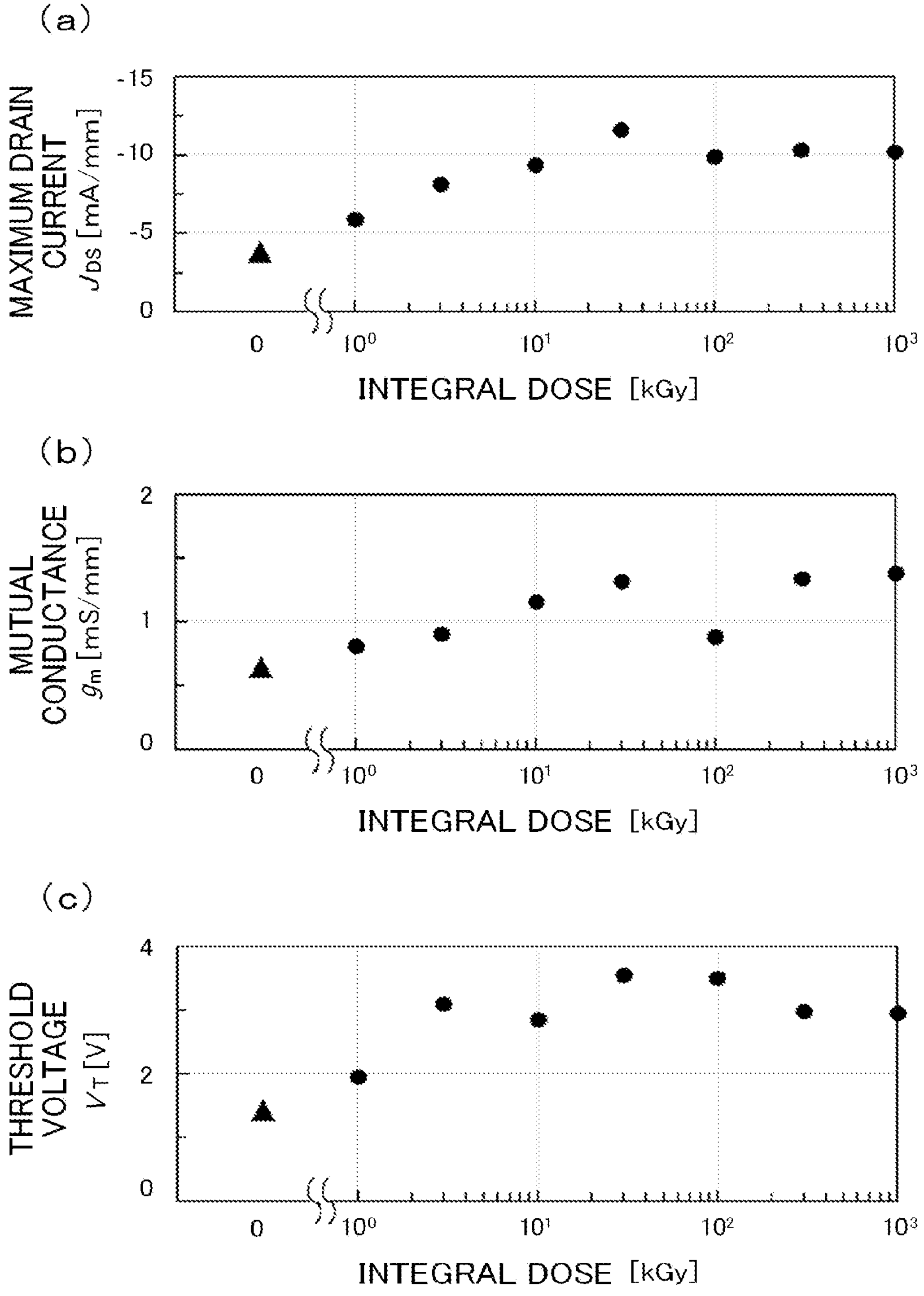
FIG. 4(*a*) is a graph showing the maximum drain current relative to an integral dose of the X-ray.

Results of the performance evaluation are shown in FIG. 2 to FIG. 4. The graph of each of FIG. 2(*a*) to FIG. 2(*d*) shows drain current vs drain voltage characteristics. FIG. 2(*a*) relates to the characteristics before the application of an X-ray. FIG. 2(*b*) relates to the characteristics at the time of application of an X-ray for an amount of 10 kGy. FIG. 2(*c*) relates to the characteristics at the time of application of an X-ray for an amount of 100 kGy. FIG. 2(*d*) relates to the characteristics at the time of application of an X-ray for an amount of 1 MGy. An initial variation of the characteristics was observed before the application of the X-ray for an amount of 10 kGy. However, because there was no significant change between the graphs of FIG. 2(*b*) to FIG. 2(*d*), it is clear that variations of the element characteristics were suppressed by the application of the radioactive ray. An initial variation is observed even in a high temperature environment, and the initial variation is stabilized by performing a process for about an hour under an environment at about 400 degrees centigrade. According to FIG. 2(*b*) to FIG. 2(*d*), the drain conductance (output impedance) in a saturated region is equal to or more than 5 MΩmm. The drain conductance in a linear region is equal to or less than 2 MΩmm.

The graph shown in FIG. 3 shows gate voltage vs drain current characteristics when the drain voltage is −10V. In the graph, "□" relates to the characteristics at the time of application of an X-ray for an amount of 100 kGy, "X" relates to the characteristics at the time of application of an X-ray for an amount of 100 kGy, and "O" relates to the characteristics at the time of application of an X-ray for an amount of 1 MGy. According to FIG. 3, a leak current at $V_{GS}<-3$ V is equal to or less than $10^{-7}$ A/mm. When X-rays for amounts of 100 kGy, 300 kGy, and 1 MGy are applied, sub-threshold swings are 238, 215, and 264 mV/decade, respectively. As such, each of these sub-threshold swings is equal to or less than 300 mV/decade. This indicates that the interface state does not increase even when the integral dose of the applied X-ray becomes large. Furthermore, a shift amount of the threshold voltage after the initial variation is equal to or less than 1 V.

The graph in FIG. 4(*a*) shows the maximum drain current in response to an applied X-ray. The graph in FIG. 4(*b*) shows a mutual conductance in response to an applied X-ray. The graph in FIG. 4(*c*) shows a threshold voltage in response to an applied X-ray. The drain voltage was −10 V in each of FIG. 4(*a*) to FIG. 4(*c*). According to FIG. 4(*a*), the absolute value of the maximum drain current $J_{DS}$ increases and shows an initial variation in a period from non-application of the X-ray to the application of the X-ray for an amount of 10 kGy, and the absolute value is more or less constant when the X-ray for an amount of more than 10 kGy is applied. To put it differently, the absolute value of the maximum drain current scarcely decreases in a period from the end of the initial variation to the application of the X-ray for an amount of 1 MGy. According to FIG. 4(*b*), the absolute value of the mutual conductance g m increases and shows an initial variation in a period from non-application of the X-ray to the application of the X-ray for an amount of 10 kGy, and the absolute value is saturated and more or less constant when the X-ray for an amount of more than 10 kGy is applied. To put it differently, the mutual conductance scarcely decreases in a period from the end of the initial variation to the application of the X-ray for an amount of 1 MGy. According to FIG. 4(*c*), the absolute value of the threshold voltage V T increases and shows an initial variation in a period from non-application of the X-ray to the application of the X-ray for an amount of 10 Gy, and the absolute value is more or less constant when the X-ray for an amount of more than 10 kGy is applied. A range of variation of the threshold voltage in a period from the initial variation to the application of the X-ray for an amount of 1 MGy is not higher than 1 V. In another example, similar performance evaluation by the application of X-rays for an amount of 1 to 5 MGy was performed. In this example, the maximum drain current, the mutual conductance, and the threshold were all saturated and constant. In summary, the result of the another example and the result shown in FIG. 4 indicate that, in a period from the initial variation to the application of the X-ray for an amount of 5 MGy, the absolute values of the maximum drain current and the mutual conductance scarcely decrease and the variation range of the threshold is not higher than 1 V.

Figure 5:
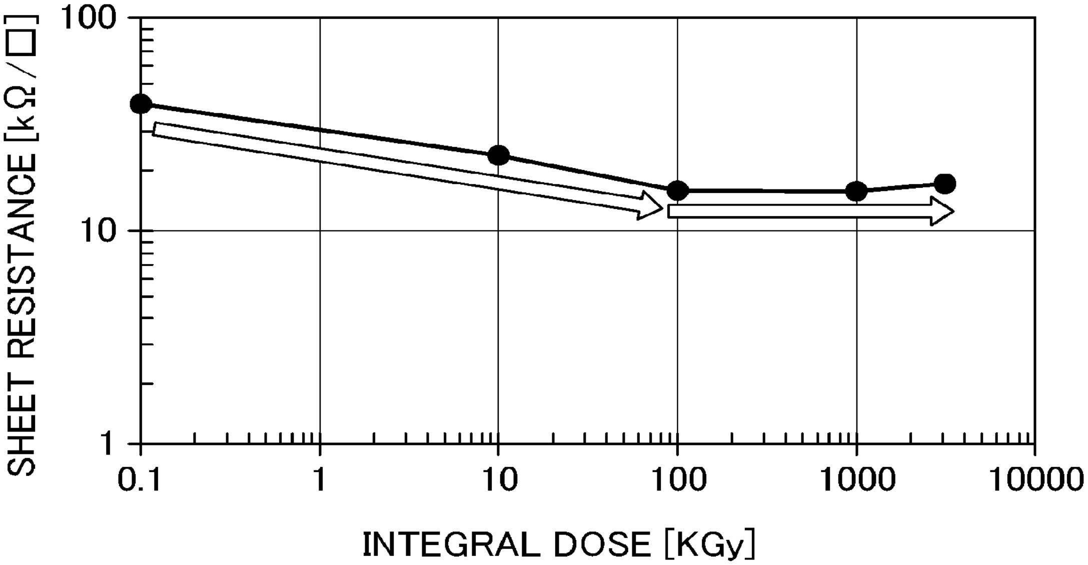
FIG. 5 is a graph showing sheet resistance related to the example shown in FIG. 3.

In the present example, as shown in FIG. 5, the sheet resistance of the field effect transistor 1 decreased in accordance with increase of the integral dose to about 100 kGy, and the sheet resistance was maintained to be at a constant value while the integral dose increased from 100 kGy. It is considered that the sheet resistance exhibits such characteristics in accordance with the amount of the applied X-ray because of the following scheme (see FIG. 6). As a result of the application of an X-ray, electron-hole pairs are generated in $Al_2O_3$ of which the insulating layer 18 is made. Because $Al_2O_3$ has defects, positive holes are induced on the hydrogen-terminated diamond layer 11 side because the generated electrons are captured by the defects.

Because the induction of the positive holes results in increase of the carrier density, the electrical conductivity is improved and the sheet resistance is decreased. These defects are considered to be oxygen-vacancy defects or defects that are generated due to impurities or disturbance in crystal structure and capture electrons.

Because the number of the above-described defects is limited, almost all of the defects capture the electrons after an X-ray is applied for a certain amount, and the defects can no longer capture electrons any more. For this reason, after a predetermined amount (about 100 kGy in the result) of an X-ray is applied, capture of electrons and induction of positive holes scarcely occur in response to further application of the X-ray. The sheet resistance is therefore stabilized in response to the application of an X-ray for an amount exceeding the predetermined amount.

Figure 6:
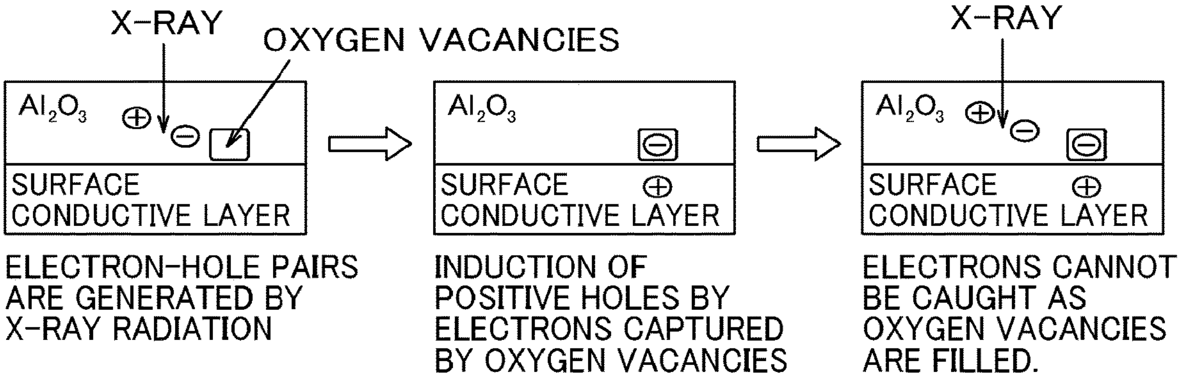
FIG. 6 is a conceptual diagram for explaining how the characteristics shown in the graphs in FIG. 4(*c*) and FIG. 5 appear.

As shown in FIG. 4(*c*), it is considered that the threshold voltage increases until the integral dose reaches about 100 kGy and the threshold voltage is maintained to be constant after the integral dose exceeds 100 kGy due to the following scheme (see FIG. 6). In a p-channel normally-on FET (field effect transistor), the FET can be switched off by removing the positive holes from the channel by applying a positive voltage to the gate. In this case, the threshold voltage is considered as a positive voltage applied to switch off the FET.

When, due to the application of an X-ray, electrons are accumulated in $Al_2O_3$ of which the insulating layer 18 is made and positive holes are induced on the hydrogen-terminated diamond layer 11 side, the density of the positive holes on a surface of the hydrogen-terminated diamond layer 11 increases. On this account, a high positive voltage corresponding to the increased density must be applied to remove the positive holes and switch off the device.

When the amount of the applied X-ray is equal to or less than the predetermined amount (about 100 kGy in the result described above), electrons generated by the application are accumulated in $Al_2O_3$, with the result that the density of the positive holes on the surface of the hydrogen-terminated diamond layer 11 increases and the threshold voltage increases. However, in response to the application of the X-ray for an amount exceeding the predetermined amount, the accumulation of electrons scarcely occurs because the defects are already filled. The threshold is therefore stabilized in response to the application of an X-ray for an amount exceeding the predetermined amount.

Example 2

Figure 7:
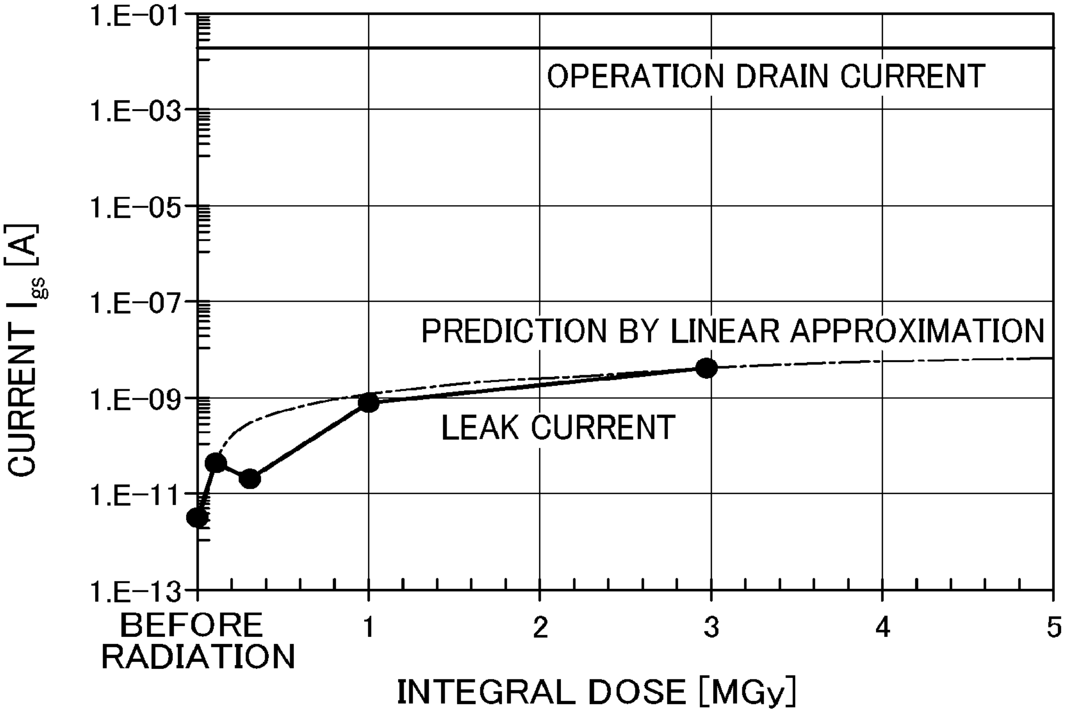
FIG. 7 is a graph showing a leak current relative to an integral dose of an X-ray related to another example of the field effect transistor shown in FIG. 1.
Figure 8:
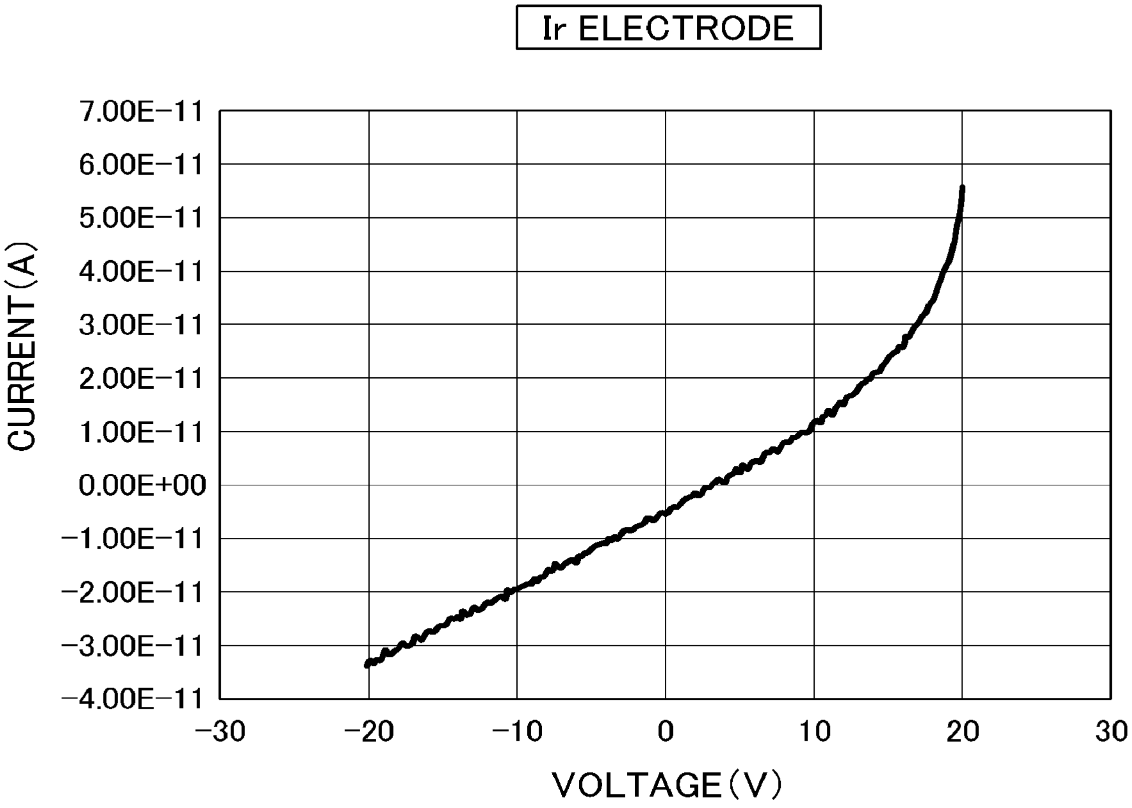
FIG. 8 is a graph showing a leak current relative to a gate voltage when an electrode of the field effect transistor shown in FIG. 1 is made of iridium.
Figure 9:
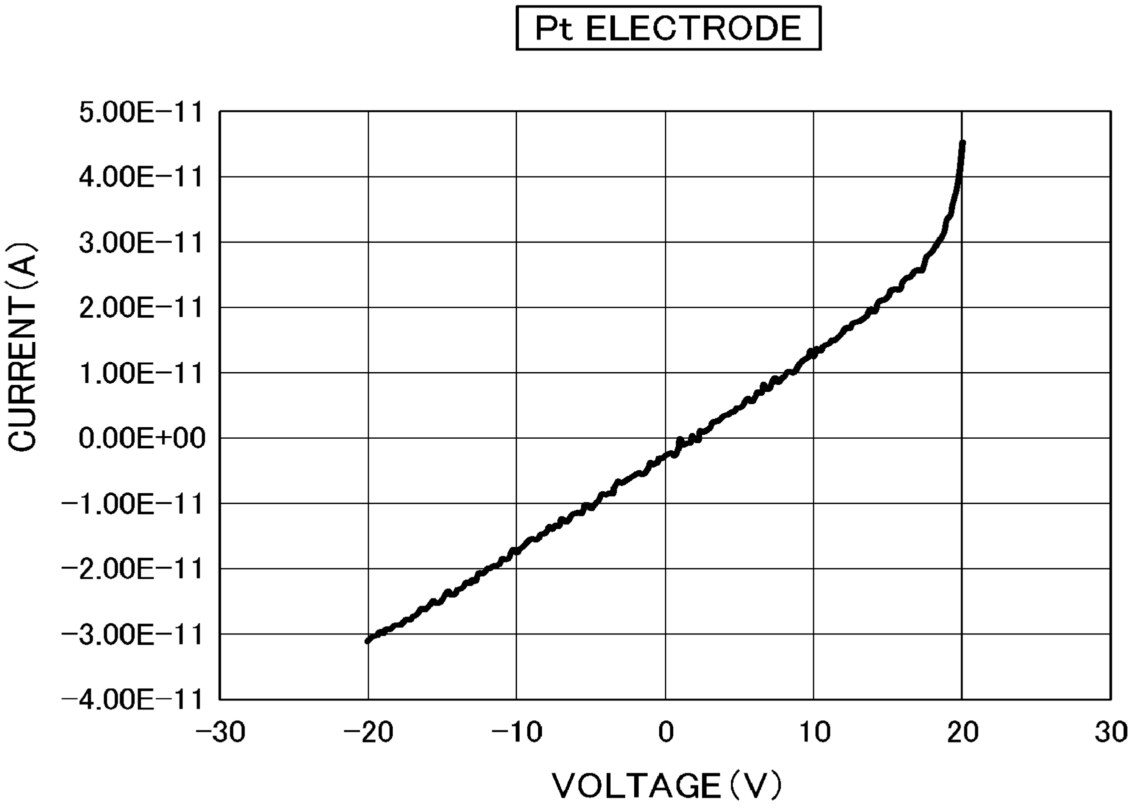
FIG. 9 is a graph showing a leak current relative to a gate voltage when an electrode of the field effect transistor shown in FIG. 1 is made of platinum.
Figure 10:
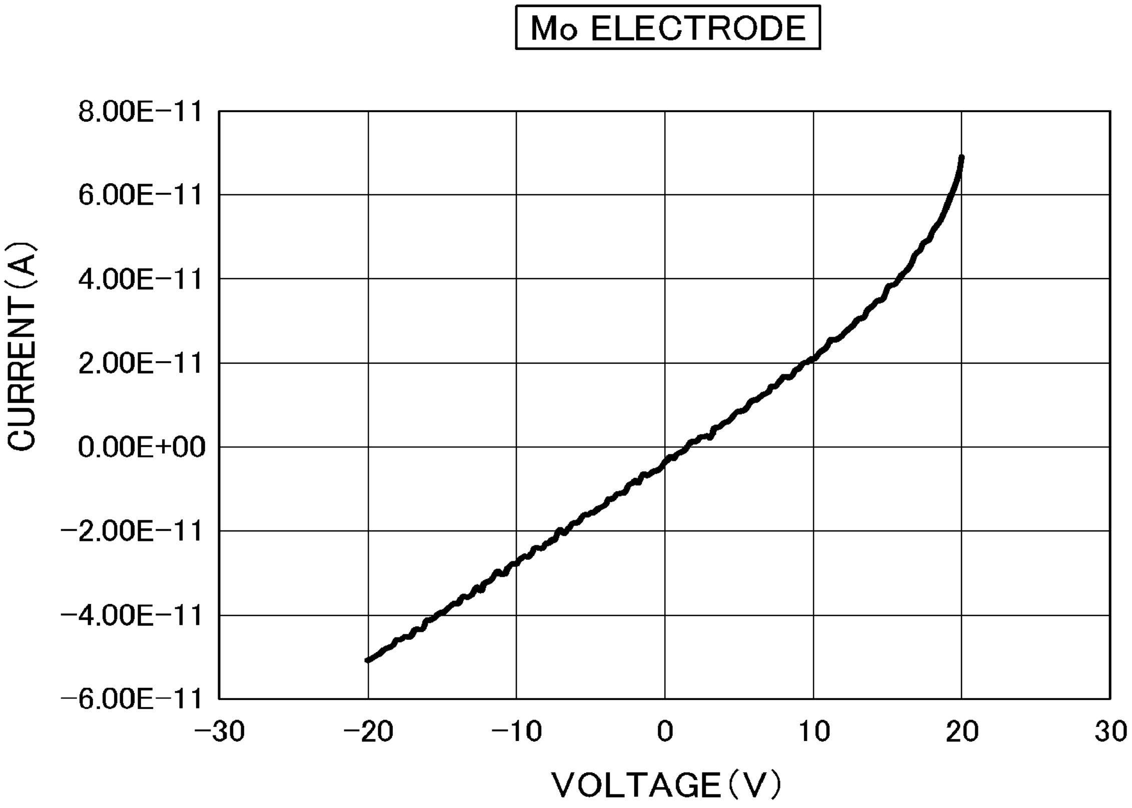
FIG. 10 is a graph showing a leak current relative to a gate voltage when an electrode of the field effect transistor shown in FIG. 1 is made of molybdenum.
Figure 11:
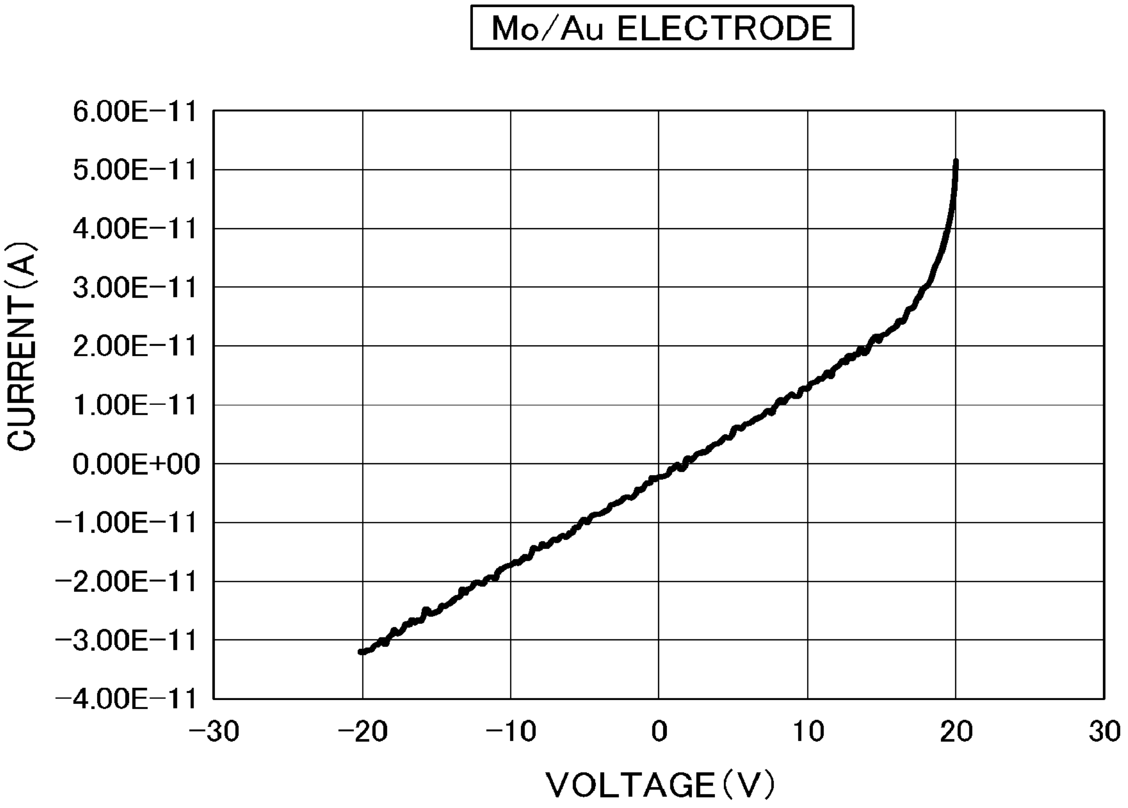
FIG. 11 is a graph showing a leak current relative to a gate voltage when an electrode of the field effect transistor shown in FIG. 1 is an electrode having plural layers of molybdenum and gold.

A leak current of the gate electrode 16 was measured in each of cases where the amounts of the X-ray applied to the field effect transistor 1 were different amounts up to 3 MGy. A field effect transistor 1 of this example was identical with that of Example 1 except that each electrode had a structure in which a layer made of gold was laminated on a layer made of ruthenium (i.e., a structure in which a gold layer was formed on a surface of a ruthenium layer so that the ruthenium layer was protected from the application of an X-ray by the gold layer). Voltages of 0 V, 0 V, and 1 V were applied to a source electrode 14, a drain electrode 15, and a gate electrode 16, respectively. FIG. 7 is a graph of a leak current $I_{gs}$ relative to an applied amount of an X-ray, showing a result of the application of the voltages. In the graph, a full line indicates an actually measured leak current, whereas a one-dot chain line indicates a linear approximation of the actually measured value. According to the graph, the leak current is assumed to be 5.2 nA relative to the amount of the applied X-ray for an amount of 5 MGy. This value is $10^{-6}$ times as large as an operation drain current of 17 mA, at the maximum. In this example, a change in appearance of the electrodes after the application of the X-ray was not observed and no trace of mutual diffusion between the ruthenium layer and the gold layer was observed after the application of the X-ray. In this connection, through an experiment in the past, the inventors of the subject application found that an electrode made of nickel and gold cannot be used under a high-radiation environment, because, when a radioactive ray was applied to a device having an electrode made of a nickel layer instead of a ruthenium layer, mutual diffusion occurred between the nickel layer and the gold layer.

Example 3

After an X-ray for an amount of 10 MGy was applied to each field effect transistor 1, a leak current of a gate electrode 16 was measured while a gate voltage was changed. The field effect transistors 1 were a transistor in which each electrode was made of iridium (hereinafter, Example 3-Ir), a transistor in which each electrode was made of platinum (hereinafter, Example 3-Pt), a transistor in which each electrode was made of molybdenum (hereinafter, Example 3-Mo), and a transistor in which each electrode was made of molybdenum and gold (hereinafter, Example 3-Mo/Au). In Example 3-Mo/Au, each electrode had a structure in which a layer made of gold was laminated on a layer made of molybdenum (i.e., a structure in which a gold layer was formed on a surface of a molybdenum layer so that the molybdenum layer was protected from the application of an X-ray by the gold layer). The graphs in FIG. 8 to FIG. 11 show results of Examples 3-Ir, 3-Pt, 3-Mo, and 3-Mo/Au, respectively.

As show in each of FIG. 8 to FIG. 11, after the application of an X-ray for an amount of 10 MGy, a leak current was increased to about $10^{-11}$ A. However, because the leak current was at most $10^{-8}$ times as large as 17 mA that was the operation current of the field effect transistor 1, the electrode of each example was sufficiently usable as a radiation-resistant electrode.

Modifications

A preferred embodiment of the present invention has been described above. It should be noted that the present invention is not limited to the above-mentioned embodiment and various changes, substitutions, and alterations can be made herein without departing from the spirit and scope of the invention as described in Solution to Problem.

For example, in the embodiment above, the source electrode 14, the drain electrode 15, the gate electrode 16, and the back gate electrode 17 are made of ruthenium, and hence the electrodes have resistance to radiation. Alternatively, these electrodes may be protected from radiation in such a way that the surface of the electrode main body made of another metal (e.g., molybdenum) is coated with gold.

In the embodiment above, the insulating layer 18 is made of aluminum oxide. Alternatively, the insulating layer 18 may be made of a different material. Examples of the material include silicon dioxide and calcium fluoride. The insulating layer 18 may be made of at least two of such materials and other materials. For example, the insulating layer 18 may be made of a material that is a combination of aluminum oxide and another material.

In the embodiment above, the deterioration of the insulating layer 18 is recovered by increasing the temperature of the field effect transistor 1 to 600 degrees centigrade or higher by applying a pulse voltage signal to the recovery electrode 21. Alternatively, the deterioration of the insulating layer 18 may be recovered by increasing the temperature of the field effect transistor 1 to 600 degrees centigrade or higher by applying a pulse voltage signal to the gate electrode 16 or the back gate electrode 17. In this case, the recovery electrode 22 may not be provided in the field effect transistor 1.

REFERENCE SIGNS LIST

- 1 field effect transistor
- 11 hydrogen-terminated diamond layer
- 12, 13 p+diamond layer
- 14 source electrode
- 15 drain electrode
- 16 gate electrode
- 18 insulating layer
- 21, 22 recovery electrode

The invention claimed is:

1. A field effect transistor, comprising:

a non-doped diamond layer having a hydrogen-terminated surface;

first and second p+diamond layers formed on the hydrogen-terminated surface of the non-doped diamond layer and sandwiching a hydrogen-terminated region;

a source electrode formed on the first p+diamond layer and made of metal;

a drain electrode formed on the second p+diamond layer and made of metal;

an insulating layer formed on the hydrogen-terminated region of the non-doped diamond layer; and a gate electrode formed on the insulating layer, wherein, based on a structure of the field effect transistor, including the insulating layer being provided on the hydrogen-terminated non-doped diamond layer, a mutual conductance of the field effect transistor is maintained equal to or higher than 0.5 mS/mm at room temperatures, even after an X-ray is applied with a dosage of 1 kGy.

2. The field effect transistor according to claim 1, wherein the insulating layer includes aluminum oxide.

3. The field effect transistor according to claim 1, wherein, each of the source electrode, the drain electrode, and the gate electrode includes at least one of ruthenium, iridium, platinum, or molybdenum.

4. The field effect transistor according to claim 1, further comprising a recovery electrode, which is an independent electrode different from the source electrode, the drain electrode, and the gate electrode, and is configured to recover circuit characteristics by at least one of recovery of defects through thermal recovery or drawing out charges.

5. The field effect transistor according to claim 1, wherein, after application of the X-ray with the dosage of 1 kGy, a leak current of the gate electrode is $10^{-6}$ times as large as an operation drain current at a maximum.

6. The field effect transistor according to claim 2, wherein each of the source electrode, the drain electrode, and the gate electrode includes at least one of ruthenium, iridium, platinum, or molybdenum.

7. The field effect transistor according to claim 2, further comprising a recovery electrode, which is an independent electrode different from the source electrode, the drain electrode, and the gate electrode, and is configured to recover circuit characteristics by at least one of recovery of defects through thermal recovery or drawing out charges.

8. The field effect transistor according to claim 2, wherein, after application of the X-ray with the dosage of 1 kGy, a leak current of the gate electrode is $10^{-6}$ times as large as an operation drain current at a maximum.

9. A field effect transistor, comprising:

a non-doped diamond layer having a hydrogen-terminated surface;

first and second p+ diamond layers formed on the non-doped diamond layer and sandwiching a hydrogen-terminated region;

a source electrode formed on the first p+ diamond layer and made of metal;

a drain electrode formed on the second p+ diamond layer and made of metal;

an insulating layer formed on the hydrogen-terminated region of the non-doped diamond layer; and a gate electrode formed on the insulating layer, a mutual conductance being equal to or higher than 0.5 mS/mm at room temperatures, even after an X-ray is applied with a dosage of 1 kGy, wherein the field effect transistor further comprises a recovery electrode, which is an independent electrode different from the source electrode, the drain electrode, and the gate electrode, and is configured to recover circuit characteristics of the field effect transistor.

10. The field effect transistor of claim 1, wherein the field effect transistor further comprises a recovery electrode, which is an independent electrode different from the source electrode, the drain electrode, and the gate electrode, and is configured to recover circuit characteristics by recovery of defects by drawing out charges from at least one of the non-doped diamond layer, the first p+ diamond layer, or the second p+ diamond layer.

* * * * *